(12) United States Patent
Kanda et al.

(10) Patent No.: US 7,471,542 B2
(45) Date of Patent: Dec. 30, 2008

(54) INFORMATION STORAGE APPARATUS STORING AND READING INFORMATION BY IRRADIATING A STORAGE MEDIUM WITH ELECTRON BEAM

(75) Inventors: Yoshihiro Kanda, Osaka (JP); Yoshihiro Mushika, Neyagawa (JP)

(73) Assignee: Panasonic Corporation, Osaka (JP)

( * ) Notice: Subject to any disclaimer, the term of this patent is extended or adjusted under 35 U.S.C. 154(b) by 598 days.

(21) Appl. No.: 10/533,582

(22) PCT Filed: Jun. 10, 2004

(86) PCT No.: PCT/JP2004/008517

§ 371 (c)(1),
(2), (4) Date: May 3, 2005

(87) PCT Pub. No.: WO2004/114314

PCT Pub. Date: Dec. 29, 2004

(65) Prior Publication Data

US 2006/0072427 A1    Apr. 6, 2006

(30) Foreign Application Priority Data

Jun. 11, 2003  (JP) .............................. 2003-166678

(51) Int. Cl.
*G11C 13/00* (2006.01)
(52) U.S. Cl. ...................... 365/118; 365/129; 365/128; 365/101; 365/100
(58) Field of Classification Search ................. 365/118, 365/129, 128; 369/101, 100
See application file for complete search history.

(56) References Cited

U.S. PATENT DOCUMENTS

| 2,755,994 A | 7/1956 | Williams et al. |
| 3,723,978 A | 3/1973 | Maffitt |
| 4,142,132 A | 2/1979 | Harte |

(Continued)

FOREIGN PATENT DOCUMENTS

JP         47-26040         10/1972

(Continued)

OTHER PUBLICATIONS

Chinese Office Action, with English Translation, issued in Chinese Patent Application No. CN 200480003374.3, dated on Mar. 14, 2008.

*Primary Examiner*—Connie C Yoha
(74) *Attorney, Agent, or Firm*—McDermott Will & Emery LLP

(57) ABSTRACT

To greatly increase the storage density of a storage apparatus, an electron beam E emitted from a cold cathode 101 is accelerated by an accelerating electrode 102, caused to converge by a convergence electrode 103, deflected by a deflection electrode 104 and applied to a minute region of a storage film 105. The storage film 105 includes, for example, a phase change film 105*a*. The film is rapidly heated and cooled to change into an amorphous state upon irradiation with an electron beam E with high energy, while being gradually cooled to change into a crystallized state upon irradiation with an electron beam E with approximately intermediate energy, thereby storing data. Upon irradiation with an electron beam E with low energy, the potential difference between a detection electrode 105*b* and an anode 105*c* is detected depending on the state, i.e., the amorphous or crystallized state, thereby reading stored data.

20 Claims, 12 Drawing Sheets

U.S. PATENT DOCUMENTS

| | | |
|---|---|---|
| 4,672,578 A | 6/1987 | Munakata et al. |
| 4,786,922 A * | 11/1988 | Hosoki et al. ............... 347/121 |
| 5,077,553 A | 12/1991 | Buzak |
| 5,576,986 A | 11/1996 | Matsuzaki et al. |
| 6,057,636 A | 5/2000 | Sakai et al. |
| 6,738,336 B2 * | 5/2004 | Naberhuis ................... 369/101 |
| 7,068,582 B2 * | 6/2006 | Jin ............................. 369/101 |

FOREIGN PATENT DOCUMENTS

| | | |
|---|---|---|
| JP | 54-42972 | 4/1979 |
| JP | 56-137578 | 10/1981 |
| JP | 57-55591 | 4/1982 |
| JP | 57-130354 | 8/1982 |
| JP | 1-217396 | 8/1989 |
| JP | 3-228294 | 10/1991 |
| JP | 7-111081 | 4/1995 |
| JP | 10-149778 | 6/1998 |
| JP | 10-247383 | 9/1998 |
| WO | WO 01/71759 | 9/2001 |

* cited by examiner

INFORMATION STORAGE APPARATUS STORING AND READING INFORMATION BY IRRADIATING A STORAGE MEDIUM WITH ELECTRON BEAM

TECHNICAL FIELD

The present invention relates to a technique for an information storage apparatus that stores and reads information by irradiating a storage medium with an electron beam.

BACKGROUND ART

As an information storage apparatus that stores and reads information by irradiating a dielectric with an electron beam, an apparatus using a cathode ray tube (CRT) similar to that for display had been studied much before core memories and semiconductor memories were put into practical use (for example, U.S. Pat. No. 2,755,994, column 2, lines 19 to 56.) In this patent, as in the case of displaying an image, a voltage of negative several thousand volts is applied to a red hot filament so as to emit thermoelectrons, and a dielectric (phosphor) is irradiated with an electron beam of the thermoelectrons, thereby storing and reading information.

More specifically, when a region of a dielectric associated with a storage bit is irradiated with a deflected electron beam, electron avalanche occurs in the irradiated region and electrons in the dielectric are emitted. In this state, the irradiated region becomes deficient in electrons. If the irradiation with the electron beam is stopped at this time, this electron deficiency state is maintained. On the other hand, if similar irradiation with an electron beam is performed from the region associated with the storage bit to its neighboring region according to scanning with the electron beam, electron avalanche also occurs in the neighboring region so that emitted electrons move to the region associated with the storage bit. At this time, the electron deficiency in the region associated with the storage bit is eliminated and the region changes into an indeficiency state. Then, this indeficiency state is maintained. That is, data "0" or "1" is stored by maintaining the electron deficiency or indeficiency state as described above.

As described above, when the region in the electron indeficiency state is irradiated with an electron beam and thereby changes into a deficiency state, the potential at a pickup plate provided on a tube face of a CRT varies depending on the change of the state. On the other hand, even when the region already in the deficiency state is irradiated with an electron beam, such a potential variation does not occur. Accordingly, stored data is read out by detecting a potential change (or current flowing due to the change) at the pickup plate.

— Problems to be Solved—

However, conventional information storage apparatuses as described above utilizing irradiation with electron beams have been replaced with core memories and then semiconductor memories, and are now not used at all because of the following reasons:

(1) The sizes of apparatuses themselves are large;

(2) Heaters and power supplies for the heaters are needed to emit thermoelectrons; and (3) High voltages of about several thousand volts are required to emit electron beams.

On the other hand, the semiconductor memories currently used in general have their sizes greatly reduced and storage densities greatly increased, as compared to the information storage apparatuses utilizing irradiation with electron beams. However, semiconductor processes have constraints in fabrication, and therefore there arises the problem of difficulty in achieving a much higher density.

In view of this, it is therefore an object of the present invention to greatly increase the storage density so as to store a large amount of information.

DISCLOSURE OF INVENTION

To solve the foregoing problems, according to the present invention, an information storage apparatus including:

a cold cathode electron beam emitting part;

a flat anode opposed to the cold cathode electron beam emitting part; and a storage medium formed on the front or back of the anode and used for storing and reading information in accordance with irradiation with an electron beam emitted from the cold cathode electron beam emitting part has the following features.

The cold cathode electron beam emitting part may include a cold cathode placed in a chamber surrounded by a partition and a film capable of transmitting an electron beam such that the inside of the chamber has a higher degree of vacuum than the outside thereof. In such a case, the degree of vacuum around a spindt-type cold cathode or carbon nanotubes, for example, is maintained and attachment of foreign matters and others are prevented with ease. Accordingly, even in the cases of a spindt-type cold cathode and a small number of carbon nanotubes, the beam spot size is more easily reduced so that the storage density is increased without decrease in stability of electron emission.

Furthermore, in a case where an accelerating part for accelerating an electron beam emitted from the cold cathode electron beam emitting part, a deflection part for deflecting the electron beam in one- or two-dimensional directions, and a convergence part for causing the electron beam to converge are provided with a given electric field or magnetic field generated, an electron beam may be accelerated in such a manner that a plurality of electrodes to which voltages with different phases are applied are provided and thereby a moving electric field is generated. The cold cathode electron beam emitting part may be configured in such a manner that a plurality of electron emitting parts are provided to emit electron beams at different timings according to the distance from a given center so that the emitted electron beams converge. With these configurations, the presence and absence of emission of an electron beam, the energy thereof and an irradiated position and an irradiated area on the storage medium, for example, are easily controlled.

To irradiate only a given region of the storage medium with an electron beam, an electron beam passing through a minute hole formed in a shielding part such as a plate member may be adjusted to reach the storage medium. If at least one of such a plate member and the storage medium is moved by an actuator using a so-called micromachine technology, reduction of an area of the storage medium irradiated with an electron beam and control of the irradiated position are also easily achieved. An electrode may be provided around the minute hole to form an electrolytic lens. Then, the efficiency in using an electron beam is enhanced and, in addition, a region irradiated with an electron beam is smaller than the diameter of the minute hole, thus further increasing the storage density.

A plurality of electron beams may be emitted to fall on a plurality of regions of the storage medium so that a plurality of bits of information is stored or read out at the same time. Accordingly, storage and reading are performed at higher speed.

An irradiated-position-shift detecting part for detecting a shift between a given reference position and a position in the storage medium irradiated with an electron beam may be provided so that the irradiated position is controlled by calibration or feedback control. Then, the accuracy in locating the irradiated position is enhanced, and the storage density is more easily increased.

Part of information stored and read out at the same time may be used for error detection or error correction.

BEST MODE FOR CARRYING OUT THE INVENTION

Hereinafter, embodiments of the present invention will be described with reference to the drawings.

(Information Storage Apparatus Including One Information Storage Cell)

Figure 1:
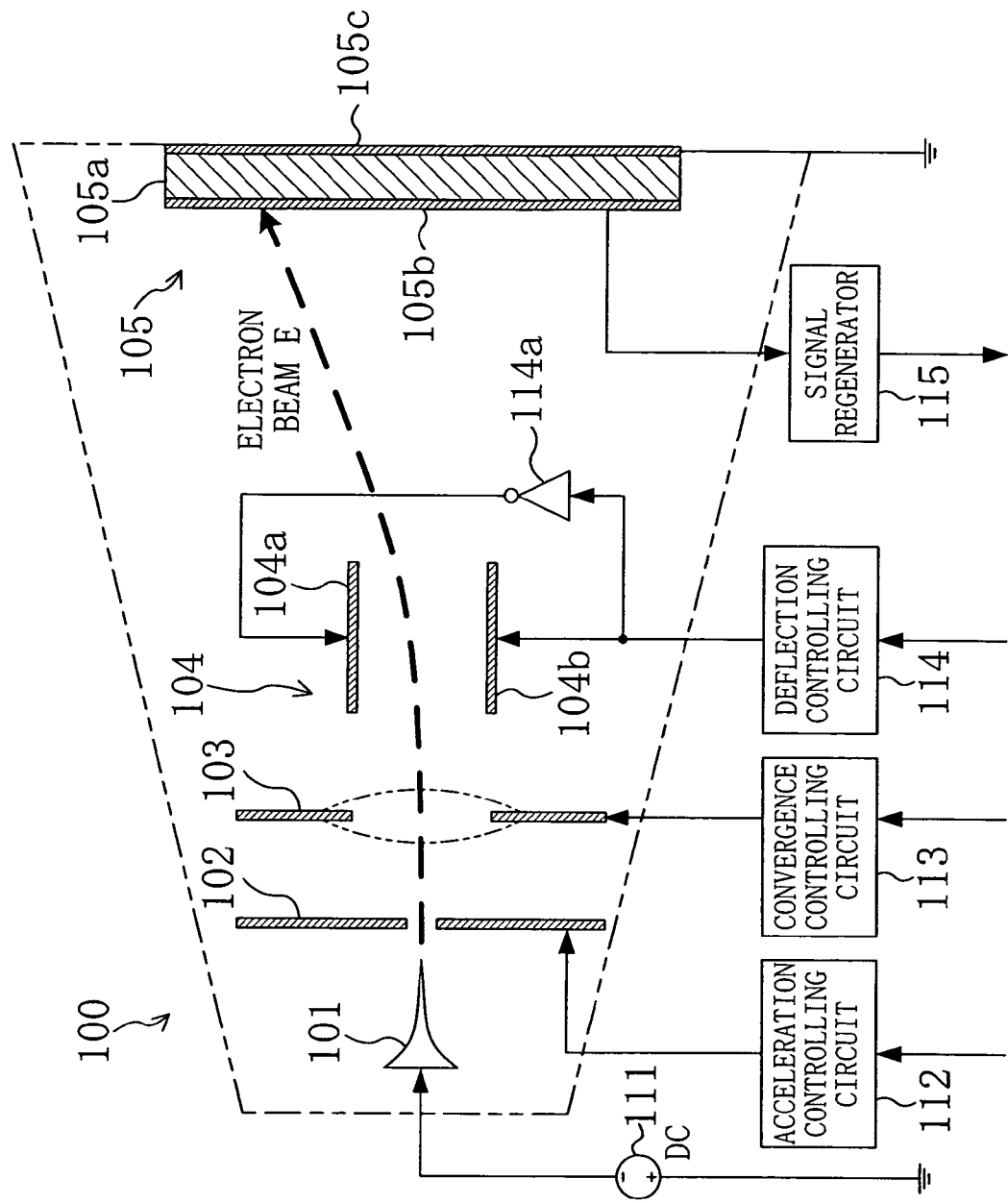
FIG. 1 is a diagram illustrating a configuration of an information storage apparatus including one information storage cell.

FIG. 1 is a view schematically showing a configuration of an information storage apparatus including one information storage cell 100.

A cold cathode 101 emits an electron beam E upon application of a negative voltage from a cathode ray driver 111. The configuration of this cold cathode 101 will be specifically described later. The voltage applied to the cold cathode 101 may be a DC voltage or a pulse driving voltage such as surge pulses.

Figure 2:
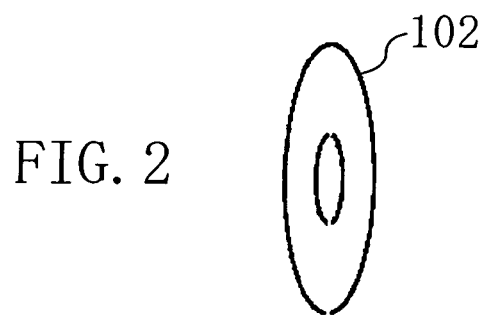
FIG. 2 is a perspective view illustrating an example of an accelerating electrode 102.

An accelerating electrode 102 is made of an annular electrode as shown in FIG. 2, for example, and receives, from an acceleration controlling circuit 112, a voltage higher than that applied to the cold cathode 101. The accelerating electrode 102 extracts electrons from the cold cathode 101 by utilizing an electric field generated between the accelerating electrode 102 and the cold cathode 101 and accelerates the electrons.

As the accelerating electrode 102, a convergence electrode 103 is made of an annular electrode. Upon application of a given voltage from a convergence controlling circuit 113, the convergence electrode 103 generates an electric field serving as a lens with respect to the electron beam E, and causes the electron beam E emitted and diverging from the cold cathode 101 to converge.

The deflection electrode 104 includes a pair of opposed electrode plates 104a and 104b and deflects the electron beam E for scanning upon application of different voltages to the respective electrode plates 104a and 104b from a deflection controlling circuit 114. In this case, a potential difference generator 114a shown in FIG. 1 controls the potential difference between the electrode plates 104a and 104b. In the case of deflecting the electron beam E in two-dimensional directions, two pairs of deflection electrodes 104 may be provided.

A storage film 105 includes: a phase change film 105a changing into an amorphous state or a crystallized state according to the degree of heating and cooling; a detection electrode 105b provided on the side of the phase change film 105a toward the cold cathode 101; and an anode 105c provided on the opposite side of the phase change film 105a. The anode 105c is grounded and the detection electrode 105b is connected to a signal regenerator 115 to detect the potential difference between the detection electrode 105b and the anode 105c. The size and pitch of a storage region for one bit in the storage film 105 is determined in accordance with permissible accuracies (variations) in the amount of deflection and the degree of convergence of an electron beam.

The cathode ray driver 111, the acceleration controlling circuit 112, the convergence controlling circuit 113 and the deflection controlling circuit 114 are configured by using D/A converters, for example. On the other hand, the signal regenerator 115 is configured by using an A/D converter.

In the information storage apparatus thus configured, information is stored and read out in the following manner.

When a potential difference at a given level or higher is applied across the cold cathode 101, and the accelerating electrode 102, electrons are emitted from the cold cathode 101, accelerated by the accelerating electrode 102, caused to converge by the convergence electrode 103, and then deflected by the deflection electrode 104, thereby irradiating a minute region of the storage film 105 with an electron beam E. At this time, if the detection electrode 105b has a resistance higher than that of the phase change film 105a, current flows into the anode 105c and hardly diffuses through the detection electrode 105b and the phase change film 105a.

In this case, when a voltage applied to the cold cathode 101 or the accelerating electrode 102 is controlled such that the potential difference therebetween is higher than or equal to a given level to supply high energy to the electron beam E, the phase change film 105a is rapidly heated. Then, when the electron beam E is shut off by setting the potential difference between the cold cathode 101 and the accelerating electrode 102 at zero, for example, after a lapse of time enough to heat the phase change film 105a to a given temperature, the electron-beam irradiated region of the storage film 105 is rapidly cooled, so that the phase change film 105a changes into an amorphous state. On the other hand, when the potential difference between the cold cathode 101 and the accelerating electrode 102 is set at a level lower than the above level to reduce the energy of the electron beam E, the phase change film 105a is heated to a temperature lower than that in the case of high energy. When the electron beam E is shut off, this heated phase change film 105a is gradually cooled to be crystallized. By changing the phase change film 105a into the amorphous state and the crystallized state with different energies of the electron beam E as above mentioned, data "0" or data "1" is stored. In the case of crystallization, the energy of the electron beam E may be gradually lowered, for example.

The phase change film 105a has different resistance values between the amorphous state and the crystallized state. Accordingly, the potential difference between the detection electrode 105b and the anode 105c upon irradiation with an electron beam E at a low energy level at which the state of the phase change film 105a does not change is larger in the case of the amorphous state than in the case of the crystallized state. In view of this, the potential difference is detected by the signal regenerator 115, thereby reading stored information.

The position in the phase change film 105a irradiated with the electron beam E is controlled at high speed by a voltage applied to the deflection electrode 104. That is, no mechanical elements such as a hard disk and an optical disk are not included, so that it is possible to store and read information at an extremely high speed. A sawtooth wave may be applied to the deflection electrode 104 so as to scan the storage film 105 with an electron beam E. If a voltage which changes stepwise is applied, random access is obtained, so that access is performed at a higher speed.

(Specific Configuration of Cold Cathode 101)

Examples of the cold cathode 101 include: a spindt-type cathode having a sharp point and made of, for example, tungsten, silicon or diamond; a cathode using a carbon nanotube; and a cathode using a ballistic electron emitting element. In particular, in the cases of using the cathode using a carbon nanotube and the cathode using a ballistic electron emission element, an electron beam E is easily generated even with a potential difference between the cold cathode 101 and the accelerating electrode 102 of 10V or less. Accordingly, power consumption is greatly reduced and, in addition, a large amount of miniaturization of the entire structure is more easily achieved.

Figure 3:
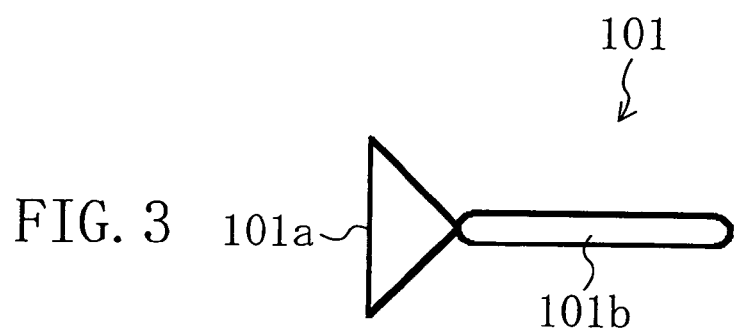
FIG. 3 is a side view illustrating an example of a cold cathode 101.

More specifically, as shown in FIG. 3, the cold cathode 101 using a carbon nanotube is configured in such a manner that one carbon nanotube 101b is provided to stand on a base 101a made of, for example, conductive silicon. If the carbon nanotube 101b is provided in this way, the electron emission source is a point electron source, so that the spot size in a region of the storage film 105 irradiated with an electron beam is reduced to a diameter of about several nanometers. Accordingly, suppose a recording point associated with one bit has a diameter of about 8 nm, if 128×128 recording points are arranged on a 1 μm-square recording face, 16 Kbits of information is stored.

Figure 4:
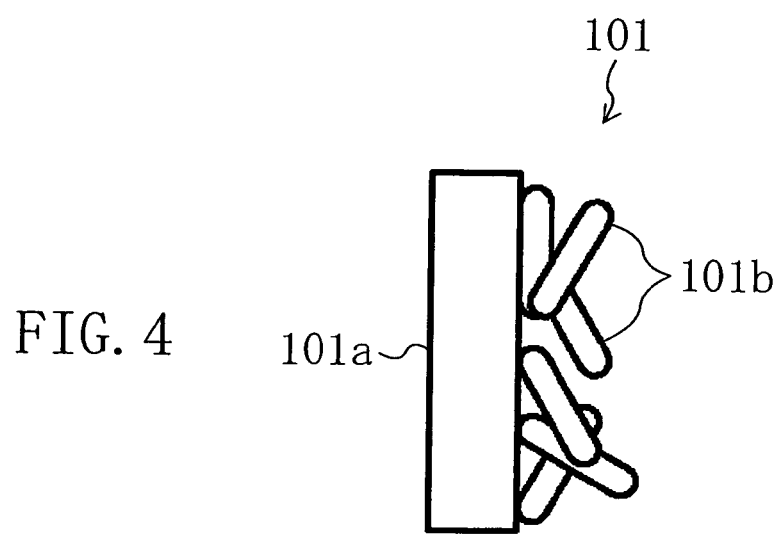
FIG. 4 is a side view illustrating another example of the cold cathode 101.
Figure 5:
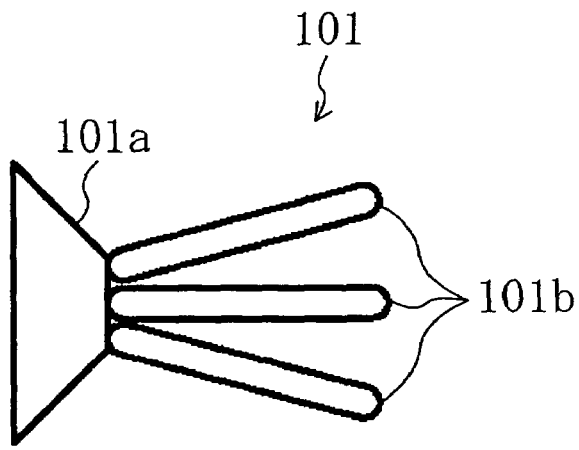
FIG. 5 is a side view illustrating yet another example of the cold cathode 101.
Figure 6:
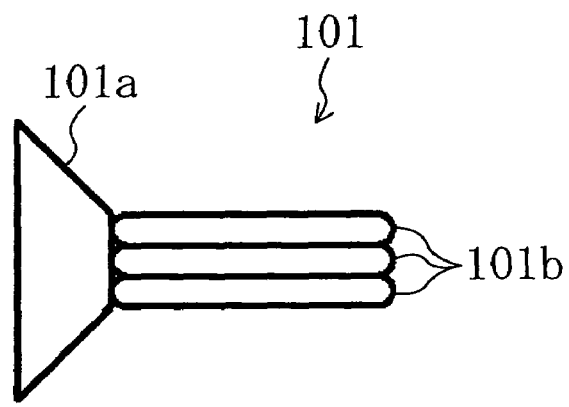
FIG. 6 is a side view illustrating still another example of the cold cathode 101.
Figure 7:
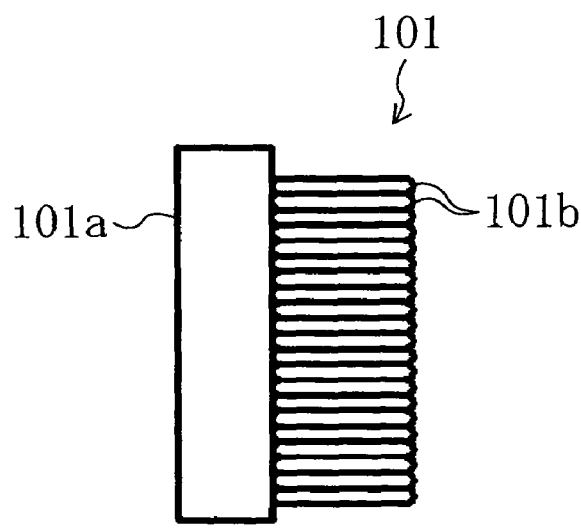
FIG. 7 is a side view illustrating still another example of the cold cathode 101.

Alternatively, the cold cathode 101 may include a plurality of carbon nanotubes. For example, as shown in FIG. 4, carbon nanotubes 101b extending in random directions may be provided on the base 101a. The cold cathode 101 having such a configuration is easily formed at a low cost by, for example, applying a solution in which carbon nanotubes are dispersed. In addition, such a cathode includes a large number of electron emitting edges, so that electrons are easily emitted with stability even at a relatively low degree of vacuum. In order to reduce the beam spot size in the presence of the carbon nanotubes 101b on a relatively large area of the base 101a, the convergence electrode 103 and other components only need to be set at high accuracy as in a converging optical system or the like. Alternatively, as shown in FIGS. 5 and 6, several carbon nanotubes 101b may be provided by vapor deposition or other processes to locally stand on a region with a diameter of 100 nm or less. In these cases, electron emission more stable than in the case of providing one carbon nanotube 101b is easily performed. In addition, the beam spot size is relatively easily reduced by making an electron emission source closer to a point electron source. Furthermore, as shown in FIG. 7, a large number of carbon nanotubes 101b having substantially the same length may be densely arranged in substantially the same direction. In this case, more stable emission of electrons is easily performed and fabrication is relatively easily performed.

Figure 8:
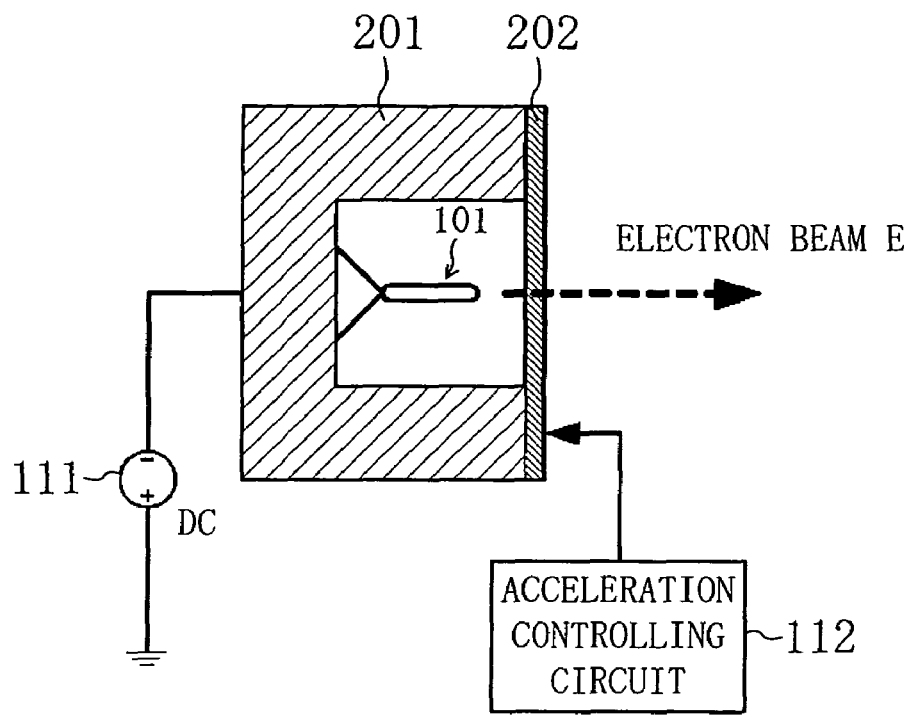
FIG. 8 is a cross-sectional view illustrating still another example of the cold cathode 101.

Moreover, as shown in FIG. 8, for example, the cold cathode 101 may be placed in a chamber surrounded by a partition 201 and a film 202 of a thin film made of, for example, gold with a high ductility and capable of transmitting an electron beam such that the inside of the chamber has a higher degree of vacuum than the outside thereof. Specifically, it is not always easy to maintain a high degree of vacuum between the cold cathode 101 and the storage film 105 because molecules are readily scattered during collision of electrons with the storage film 105. However, if the cold cathode 101 is placed in the small chamber as described above, the space surrounding the cold cathode 101 is kept at a high degree of vacuum and adhesion of foreign matters to the cold cathode 101 is prevented, so that stable emission of electrons is performed even in the case of providing a small number of carbon nanotubes. Accordingly, the beam spot size is more easily reduced without decrease in stability of electron emission. In the foregoing configuration, a conductive film may be used as the film 202 to also serve as the accelerating electrode 102.

Figure 9:
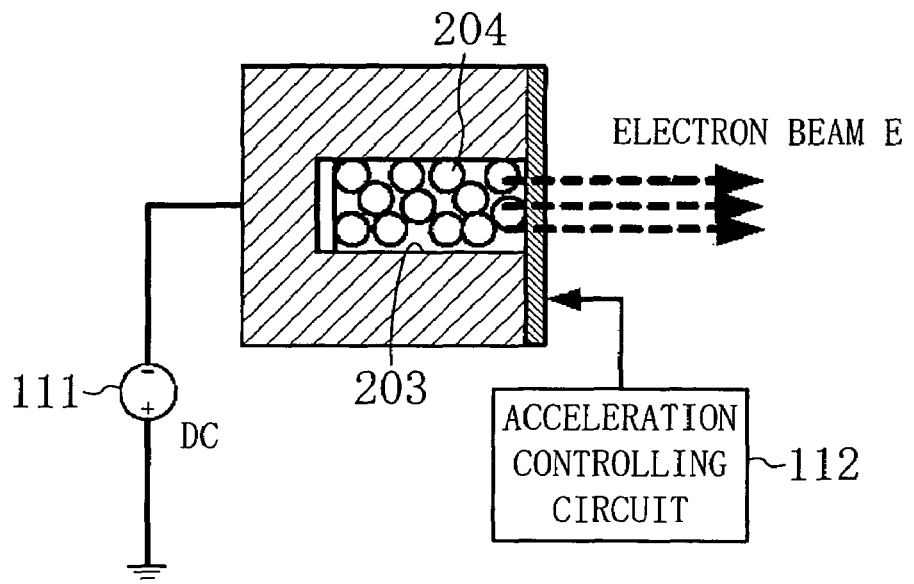
FIG. 9 is a cross-sectional view illustrating an example of a ballistic electron emitting element.

In addition, a ballistic electron emitting element that may replace the cold cathode 101 as described above is obtained by, for example, forming silicon impalpable particles 204 in a minute cavity 203 with a diameter of about 100 nm or less as shown in FIG. 9. In the case of using such a ballistic electron emitting element, stable emission of a high-energy electron beam is easily achieved.

(Configuration of Accelerating Electrode 102 and Other Components)

The accelerating electrode 102, the convergence electrode 103 and the deflection electrode 104 are not limited to the above-described electrodes including the annular electrodes and opposed electrodes and may be cylindrical electrodes, coils for generating magnetic fluxes, or any combination of such electrodes and coils. In addition, a plurality of convergence electrodes 103 may be provided to generate a desired electric field with higher accuracy.

Figure 10:
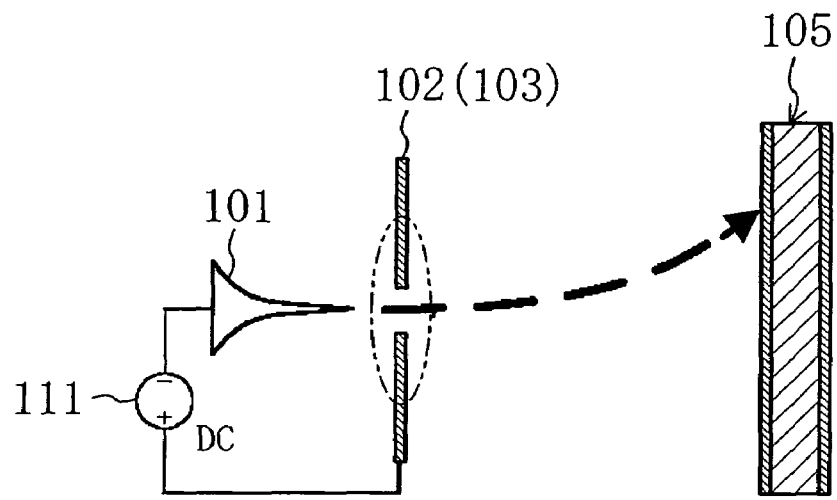
FIG. 10 is an illustration showing an example in which a component serving as both the accelerating electrode 102 and a convergence electrode 103 is used.

In addition, as shown in FIG. 10, for example, only one of the accelerating electrode 102 and the convergence electrode 103 may be provided and have functions of accelerating the electron beam E and causing the electron beam E to converge upon application of a positive voltage to the cold cathode 101.

Figure 11:
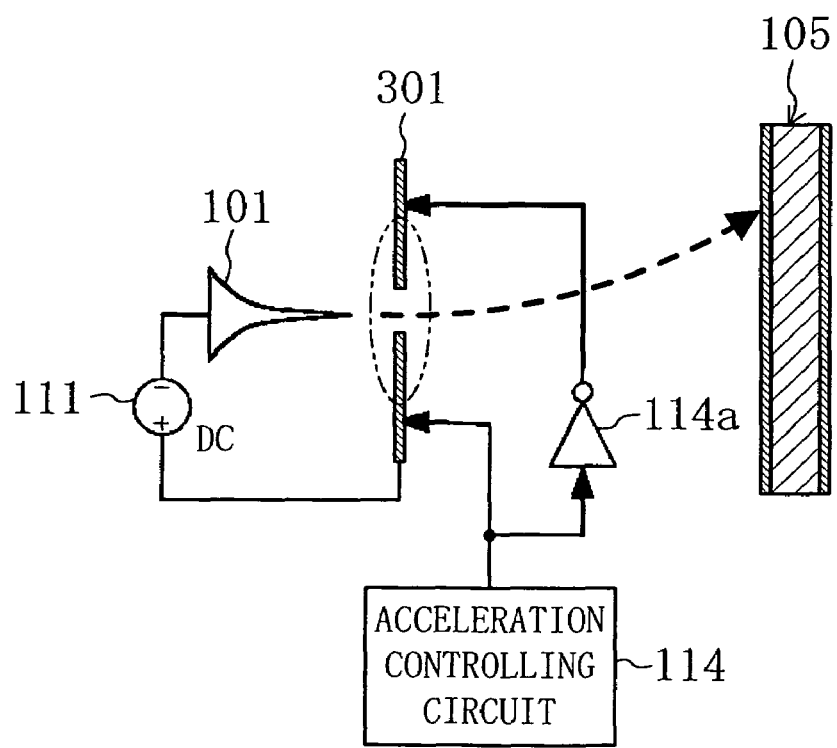
FIG. 11 is an illustration showing an example in which a component serving as both the accelerating electrode 102 and a deflection electrode 104 is used.
Figure 12:
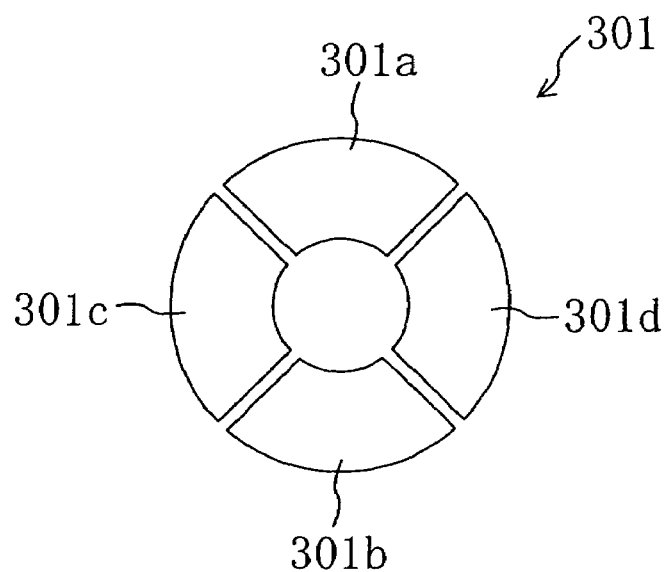
FIG. 12 is a front view illustrating an example of an electrode serving as both of the accelerating electrode 102 and the deflection electrode 104.

Furthermore, as shown in FIGS. 11 and 12, an annular electrode 301 may be divided into four so as to replace both of the accelerating electrode 102 and the deflection electrode 104. In addition, if the average potential of the divided electrodes 301a through 301d is higher than that of the cold cathode 101 and the divided electrodes 301a and 301b and/or the divided electrodes 301c and 301d have a potential difference/potential differences, i.e., if the relative potentials of the respective divided electrodes 301a through 301d are controlled, the electron beam E is accelerated and deflected. (In the case of deflecting the electron beam E only in one-dimensional directions, for example, the annular electrode 301 only needs to be divided into two.)

Alternatively, a component serving as both the convergence electrode 103 and the deflection electrode 104 may be used. (In this case, it can be considered that adjustment of relative potentials moves the center of an equivalent electron lens so that the focal point of an electron beam shifts in the X-Y direction.) Furthermore, a component serving as the accelerating electrode 102, the convergence electrode 103 and the deflection electrode 104 may be used with a positive voltage applied to the divided electrodes 301a through 301d as described above. That is, the components such as the accelerating electrode 102 do not necessarily need to be physically separated and it is sufficient for these components to have the above functions as a whole.

If an electron beam E with sufficient energy is obtained by using the potential difference between the cold cathode 101 and the storage film 105, it is unnecessary to provide the accelerating electrode 102.

Figure 13:
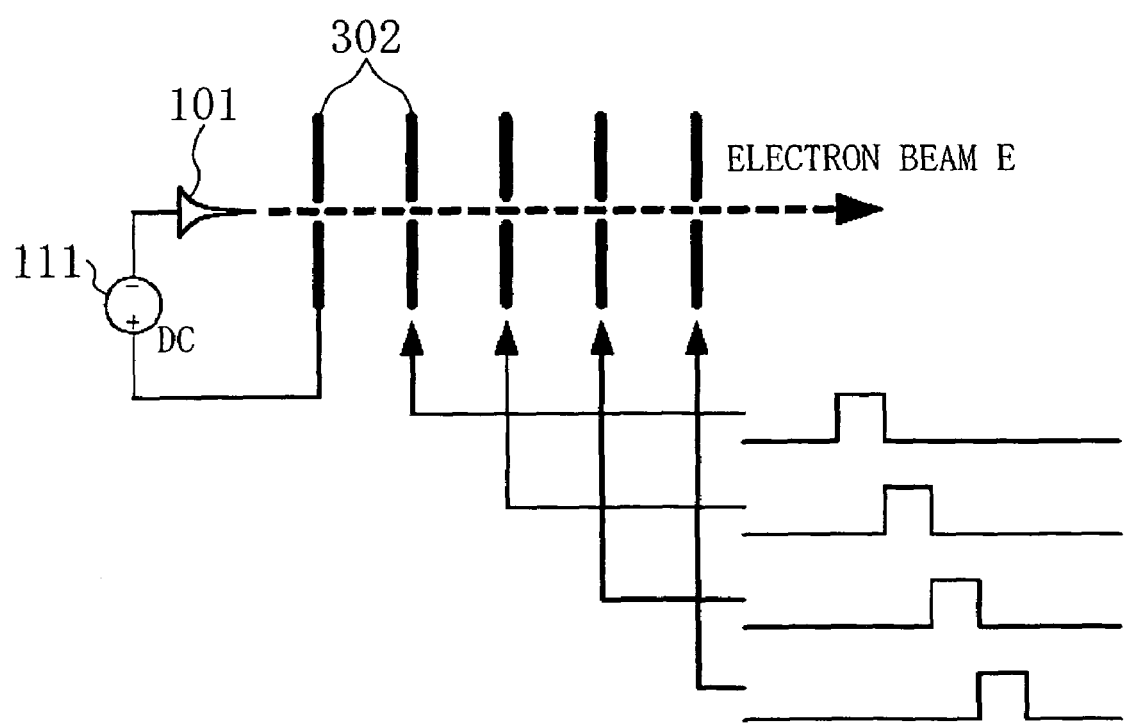
FIG. 13 is an illustration showing an example of annular electrodes 302 for generating a moving electric field.

As shown in FIG. 13, for example, a plurality of annular electrodes 302 may be provided such that pulse voltages with different phases are sequentially applied to generate a moving electric field and thereby accelerate the electron beam E. In this case, the generated electrode beam E has high coherence with, i.e., the same speed and same phase as, the moving electric field. Accordingly, the beam spot size is more easily reduced.

Figure 14:
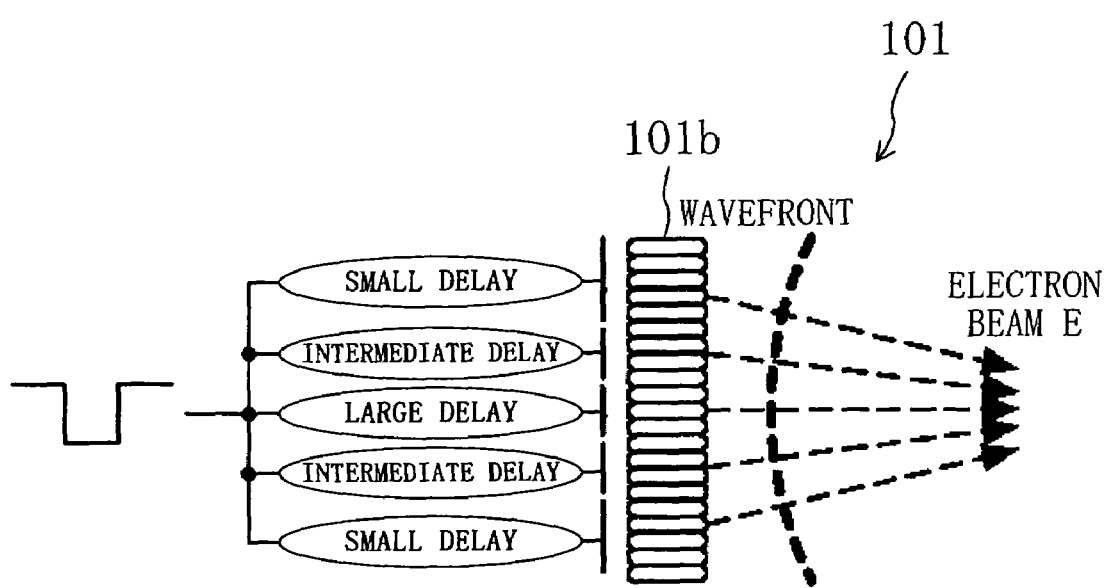
FIG. 14 is a side view illustrating an example of the cold cathode 101 for emitting an electron beam which will converge.

Furthermore, as shown in FIG. 14, for example, carbon nanotubes 101b densely arranged to form a plane may be divided into a plurality of regions, e.g., concentric regions, and electron-beam generating pulse voltages with different delay times may be applied to the respective regions of the carbon nanotubes 101b. Then, the electron beam E converges according to a principle similar to that in a phased array radar.

(Other Configurations for Controlling Region Irradiated with Electron Beam E)

Figure 15:
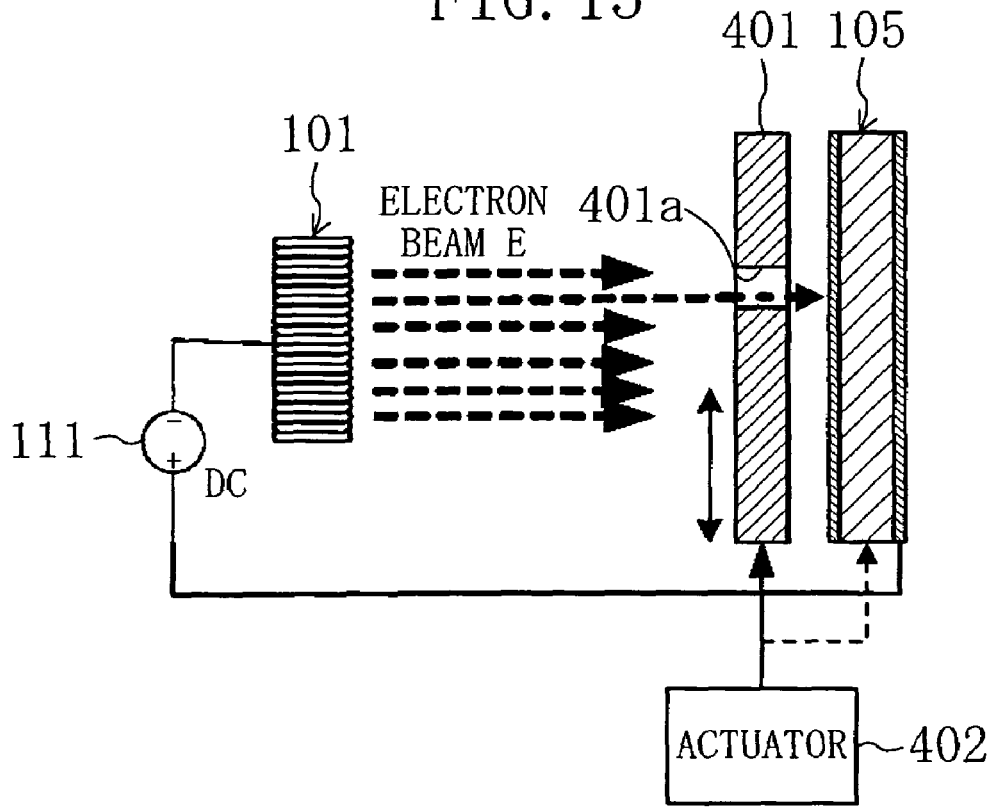
FIG. 15 is an illustration showing another configuration for controlling a region irradiated with an electron beam.

Instead of convergence and deflection of an electron beam E as described above, at least one of a shielding plate 401 in the shape of a plate having a minute hole 401a (pin hole) and the storage film 105 may be moved by an actuator 402, as shown in FIG. 15, for example. The actuator 402 may be constructed by an electrostatic actuator unit and an elastic member, for example. If two pairs of electrostatic actuator units and others are used, a two-dimensional drive is easily performed.

By shielding an electron beam E by using the shielding plate 401 as described above, control of a region irradiated with the electron beam E is ensured and the storage density is easily increased. In addition, an electron emitting part of the cold cathode 101 does not need to be very small, so that stable emission of electrons is easily achieved. In addition, the configuration is simplified because the convergence electrode 103 and other components are not needed. However, the convergence electrode 103 and other components may be provided to enhance the energy of the electron beam and to perform convergence and deflection of the electron beam so that the efficiency in utilizing the electron beam is increased. Even in such a case, the region irradiated with the electron beam is accurately controlled by the shielding plate 401, so that the accuracy in controlling convergence and deflection does not need to be maintained at such a high level.

In a case where the shielding plate 401 is placed at a fixed position with respect to the cold cathode 101 and the storage film 105 is moved, the configuration of the movable part is easily simplified because the storage film 105 is located at the outside of the shielding plate 401. Alternatively, since the relative positions of the cold cathode 101 and the shielding plate 401 do not change, the cold cathode 101 and the shielding plate 401 may be united so as to simplify the configuration and fabricate the apparatus with ease. In addition, the cold cathode 101 only needs to emit electrons in such a manner as to allow only a portion associated with the hole 401a in the shielding plate 401 to be irradiated with an electron beam E. Accordingly, power consumption is easily reduced.

Figure 16:
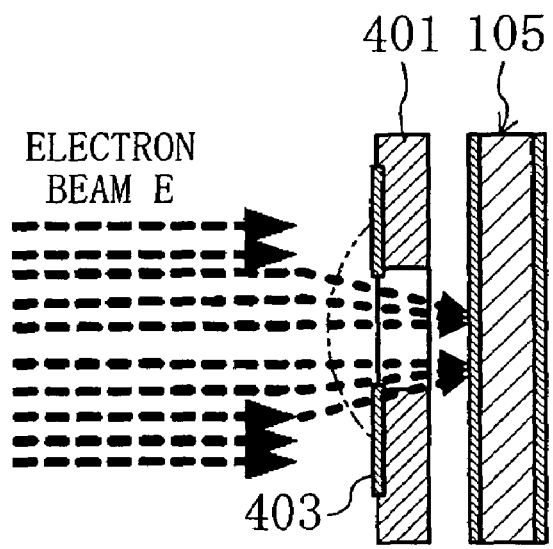
FIG. 16 is an illustration showing yet another configuration for controlling a region irradiated with an electron beam.

In the case of using the shielding plate 401 as described above, a conductor 403 may be provided around the hole 401a as shown in FIG. 16, for example, and a given voltage may be applied to the conductor 403 so that an electric field functioning as a lens is generated. Then, part of an electron beam in the vicinity of the hole 401a converges to also strike the storage film 105, so that the efficiency in utilizing an electron beam is enhanced and a region smaller than the hole 401a can be irradiated with the electron beam. Instead of the conductor 403 described above, the shielding plate 401 itself may have conductivity.

(Information Storage Apparatus Including a Plurality of Information Storage Cells)

An information storage apparatus including a plurality of information storage cells 100 as described above and capable of writing and reading information at the same time will be described.

Figure 17:
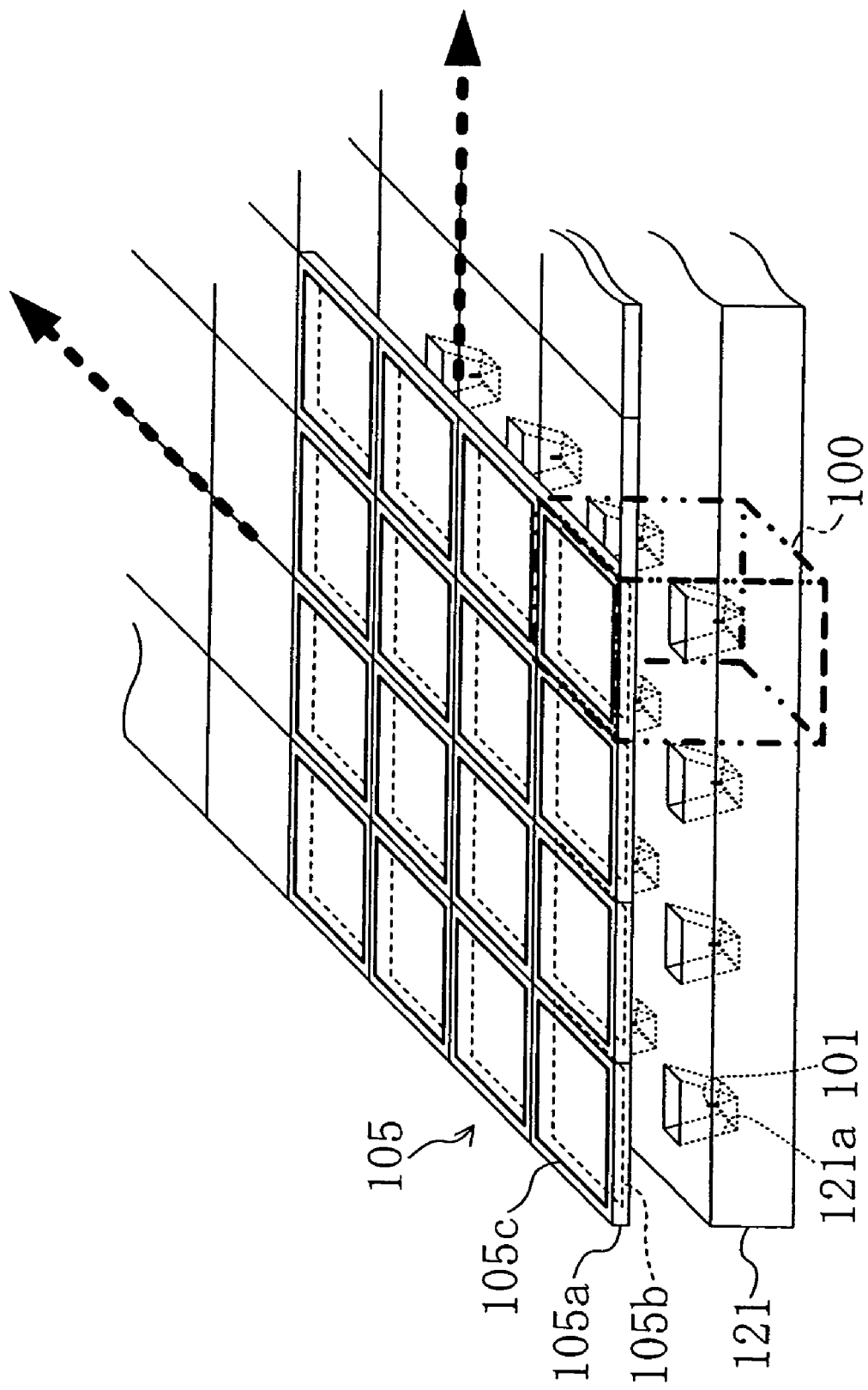
FIG. 17 is a perspective view showing a configuration of an information storage apparatus including a plurality of information storage cells.

FIG. 17 is a perspective view showing a configuration of an information storage apparatus. In this information storage apparatus, the information storage cells 100 as shown in FIG. 1 are arranged in columns and rows. More specifically, the information storage apparatus includes a substrate 121 in which a plurality of holes 121a are formed and cold cathodes 101 similar to the cold cathode shown in FIG. 1 and other components are provided in the respective holes 121a. A storage film 105 is provided above the substrate 121 such that a vacuum is created between the substrate 121 and the storage film 105. (The substrate 121 and the storage film 105 may be closely in contact with each other so that the holes 121a are individually kept under vacuum.)

Figure 18:
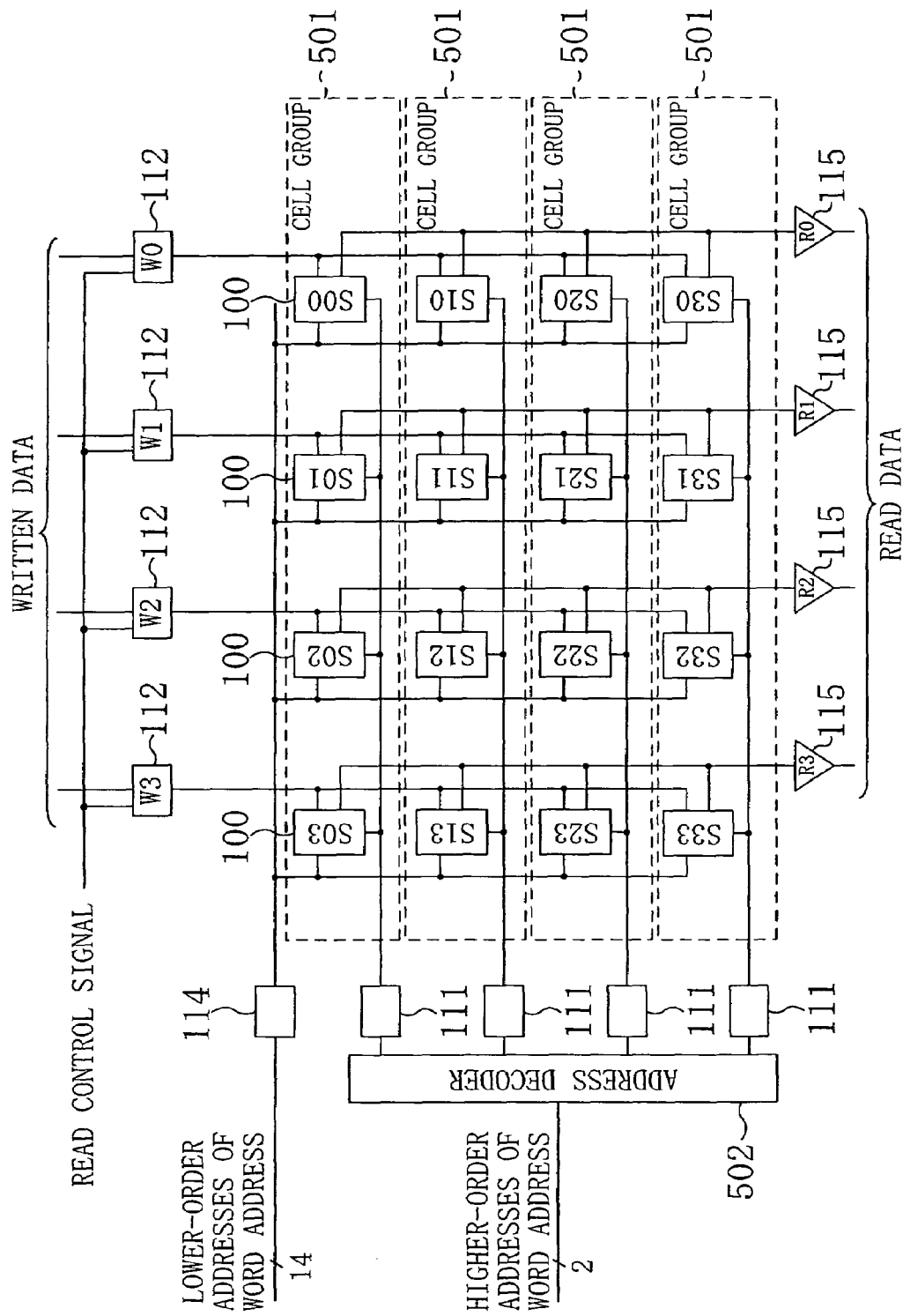
FIG. 18 is a block diagram showing a connection relationship among cathode ray drivers and other elements in the information storage apparatus including the plurality of information storage cells.

Each four information storage cells 100 are determined as a group and four bits of data is written and read out as one word at the same time. Specifically, as shown in FIG. 18, for example, each four information storage cells 100 (e.g., S00 through S03) are set as a group and constitute a cell group 501 and a plurality of (e.g., four in the example shown in the drawing) such cell groups 501 are provided.

Cathode line drivers 111 are associated with the respective cell groups 501. One of the cathode ray drivers 111 is selected by an address decoder 502 for decoding two highest-order bits of a word address and a negative voltage (e.g., −5V) is applied to the cold cathodes 101 of the information storage cells 100 constituting the associated cell group 501.

A deflection controlling circuit 114 is common to the information storage cells 100 in all the cell groups 501, generates a deflecting voltage according to, for example, 14 lowest-order bits of the word address and applies the voltage to deflection electrodes 104 in the respective information storage cells 100. (In a case where recording points are arranged on the storage film 105 two-dimensionally, it is sufficient that the above-mentioned lowest-order bits are further divided and two deflecting voltages associated with the divided bits are generated.)

One acceleration controlling circuit 112 and one signal regenerator 115 are common to the information storage cells 100 at the same bit position in the respective cell groups 501.

In the information storage apparatus, to store data, a negative voltage is applied to the cold cathodes 101 of the information storage cells 100 in one of the cell groups 501 in accordance with the two highest-order bits of a word address. The acceleration controlling circuits 112 apply voltages according to written data to the accelerating electrodes 102 in the respective information storage cells 100. Accordingly, in a part of the storage film 105 associated with the information storage cells 100 whose cold cathodes 101 have received the negative voltages, a region associated with 14 lowest-order bits of a word address is irradiated with electron beams at energy levels according to respective bits of the written data. Then, as already described with reference to FIG. 1, a phase change film 105a is changed into an amorphous state or a crystallized state, thereby storing the written data accordingly.

On the other hand, to read stored data, the cathode ray drivers 111 apply negative voltages to the cold cathodes 101 of the information storage cells 100 in some of the cell groups 501 associated with the two highest-order bits of the word address. At the same time, the acceleration controlling circuits 112 apply given voltages to the accelerating electrodes 102 in accordance with a read control signal. Then, an associated part of the storage film 105 is irradiated with an electron beam at an energy level lower than that in writing, so that the voltages at the detection electrodes 105b are detected by the signal regenerators 115, thereby reading stored data.

As described above, writing or reading is performed at the same time on a plurality of (e.g., four) information storage cells 100 constituting each of the cell groups 501, so that high-speed access is achieved. In addition, one of the cell groups 501 is selected in accordance with a part of the address, so that data corresponding to words in a number that is equal to the number obtained by (the number of recording points in the respective information storage cells 100)×(the number of cell groups 501.) That is, if 4×4 information storage cells 100 each capable of storing 128×128=16 Kbits of data are provided as shown in FIG. 18, an information storage apparatus capable of storing 64 Kwords×4 bits of data is obtained. If 1024×1024 information storage cells 100 each capable of storing 128×128=16 Kbits of data are provided on a 1 μm-square recording plane, for example, a 1 mm-square storage film 105 is capable of storing a large amount of 16 Gbits (about 10 Tbits/square inches) of data at a high density.

In the foregoing example, each cell group 501 is constituted by four information storage cells 100 arranged in a line (i.e., data is written in and read out from these cells at the same time.) Alternatively, each cell group 501 may be constituted by information storage cells 100 arranged in a plurality of lines. In this case, as long as the acceleration controlling circuit 112 and the signal regenerator 115 associated with each information storage cell 100 are provided, data may be written in and read out from all the information storage cells 100 at the same time.

In the foregoing example, voltages to be applied to the cold cathodes 101 are controlled in accordance with addresses whereas voltages to be applied to the accelerating electrodes 102 are controlled in accordance with written data. Alternatively, these voltages may be controlled conversely. Alternatively, only voltages to be applied to the cold cathodes 101 or the accelerating electrodes 102 may be controlled based on addresses and written data, for example.

As described with reference to FIG. 15, in a case where a region to be irradiated with an electron beam by moving at least one of the shielding plate 401 having a minute hole 401a and the storage film 105 by the actuator 402, shielding plates 401 and/or storage films 105 of a plurality of information storage cells 100 may be moved by the same actuator 402 or these components may be moved by actuators 402 using a common control signal. Alternatively, the shielding plates 401 and/or the storage film 105 for the plurality of information storage cells 100 may be united.

(Servo Control of Electron-Beam Irradiated Position)

An example of an information storage apparatus in which an electron beam is controlled to be accurately applied to a region of the storage film 105 associated with a storage bit will be described.

Figure 19:
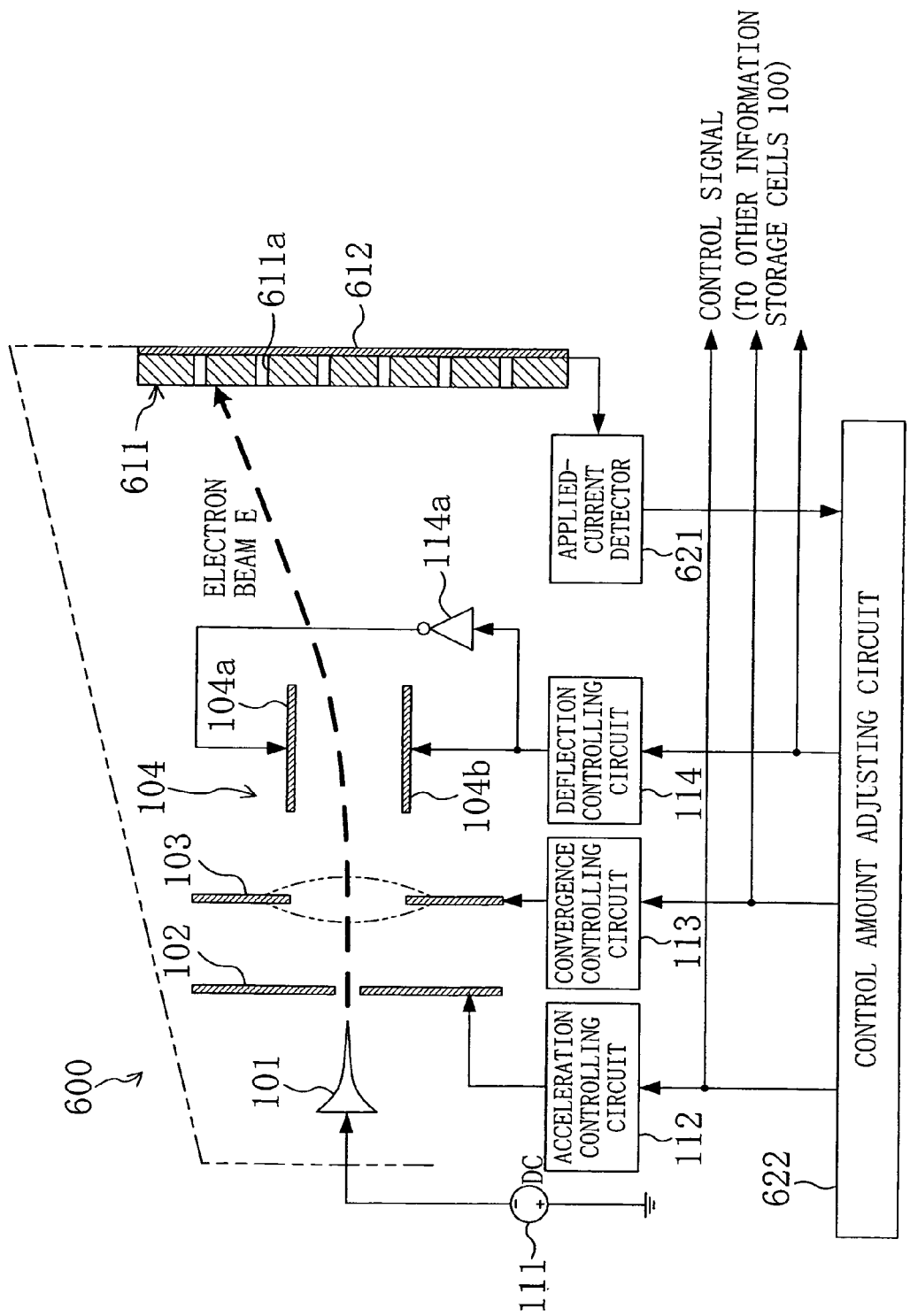
FIG. 19 is an illustration showing a configuration of a servo cell for controlling a position irradiated with an electron beam.

In addition to one or a plurality of information storage cells 100 as shown in FIG. 1, this information storage apparatus includes a servo cell 600 as shown in FIG. 19. This servo cell 600 has a configuration similar to that of the information storage cells 100 but includes an insulating film 611 and an anode 612 instead of the storage film 105. The insulating film 611 has minute holes 611a formed in positions associated with respective storage bits. The anode 612 is connected to an applied-current detector 621 so that the amount of current caused to flow by an electron beam incident via the minute holes 611a formed in the insulating film 611 is detected. The result of the detection by the applied-current detector 621 is input to a control amount adjusting circuit 622. Given control signals are input from the control amount adjusting circuit 622 to an acceleration controlling circuit 112, a convergence controlling circuit 113 and a deflection controlling circuit 114. These control signals are also input to the acceleration controlling circuits 112, the convergence controlling circuits 113 and the deflection controlling circuits 114 in the information storage cells 100.

In the information storage apparatus with the foregoing configuration, calibration is performed on the amount of deflection and the state of convergence of an electron beam before data is stored or read out. Specifically, current distribution by the electron beam exhibits normal distribution having the maximum value at its center, for example. Accordingly, with respect to current flowing in the anode 612 by an electron beam incident on the anode 612 via each of the minute holes 611a, the center of the electron beam coincides with the center of the minute hole 611a and the current is at the maximum when the beam diameter of the electron beam at the insulating film 611 is at the minimum. In view of this, the amount of deflection and the degree of convergence are varied to small extent at every minute hole 611a so that an optimum value of the control amount at which the current flowing in the anode 612 is at the maximum is obtained and held in the control amount adjusting circuit 622. Based on this optimum value, the control amount adjusting circuit 622 outputs convergence control signals and deflection control signals to the information storage cells 100 in storing and reading data. This ensures stable operation in which variation in configuration occurring in fabrication and variation in deflection amount due to variations of power supply voltage and temperature and others are corrected.

More specifically, the calibration is performed by, for example, control operation of the control amount adjusting circuit 622 in the following manner.

(1) First, the amount of deflection is adjusted to zero by setting a voltage applied to the deflection electrode 104 at zero. An electron beam is generated so as to almost pass through a minute hole 611a formed at (near) the center of the insulating film 611. Under this condition, a voltage applied to the convergence electrode 103 is changed so as to maximize current flowing in the anode 612, i.e., to cause the electron beam to converge near the insulating film 611, so that current density is enhanced.

(2) Next, the voltage applied to the deflection electrode 104 is slightly varied such that the current flowing in the anode 612 is maximized, i.e., the minute hole 611a is accurately irradiated with the electron beam. (In a case where recording points are two-dimensionally arranged, it is sufficient to deflect the electron beam to small extent in the X and Y directions alternately so as to maximize the current.)

(3) Then, the degree of convergence of the electron beam is adjusted in the same manner as in (1).

Through (1) through (3), the position irradiated with the electron beam and the focal point of convergence are coincide with each other with respect to the minute hole 611a located at the center of the insulating film 611.

(4) The amount of deflection is varied stepwise to a sufficiently small amount at each step from the minimum to the maximum so that the electron beam is gradually moved from an edge of a storage region to the other in the storage film 105. In this way, a control amount at which the current flowing in the anode 612 is at the maximum is obtained and is held in the control amount adjusting circuit 622. That is, a deflection amount at which current flowing upon irradiation with an electron beam via each minute hole 611a formed through the insulating film 611 is at the maximum is obtained and held. A voltage applied to the convergence electrode 103 for each minute hole 611a may also be controlled. In addition, voltages applied to the cold cathode 101 and the accelerating electrode 102 may also be controlled so as to reduce variation in the intensity of an electron beam.

In storing and reading data, control signals are input from the control amount adjusting circuit 622 to the respective information storage cells 100 based on the control amount held in the foregoing manner, so that high reproducibilities of the irradiated position and the degree of convergence of an electron beam are obtained and data is stored and read out with accuracy. Accordingly, the storage density is further increased and, in addition, the efficiency in utilizing an electron beam is easily enhanced.

In the foregoing example, the insulating film 611 having the minute holes 611a is used. However, the present invention is not limited to this. A resistor or the like may be placed on, for example, the anode 612 so as to detect current varying depending on the presence and absence of the resistor or the like at the position irradiated with an electron beam. Alternatively, a resistive film or a resistive plate having a uniform resistivity may be provided and a position irradiated with an electron beam may be detected based on voltages near the midpoints of the respective four sides or vertexes, for example, so as to irradiate a given position with an electron beam. In the case of ensuring the accuracy in irradiating a relative position with an electron beam with respect to each recording point, calibration as described above may be performed only on one of the recording points so that the amounts of deflection with respect to the other recording points are controlled based on the calibration.

Only one servo cell 600 as described above may be provided in the entire information storage apparatus. In a case where a large number of the information storage cells 100 are provided, for example, the servo cell 600 may be provided for each given number of information storage cells 100.

The calibration is not necessarily performed before data is stored or read out in the manner as described above. Alternatively, feedback control may be performed on a position irradiated with an electron beam in the servo cell 600 with emission of electron beams in the information storage cells 100 suppressed, and then emission of the electron beams in the information storage cells 100 may start when the irradiated position in the servo cell 600 comes to a target position. In addition, a conductor or a slit may be provided at a reference position in the insulating film 611 in the servo cell 600 or in the periphery of the storage film 105 in the information storage cells 100 so as to perform writing or reading in accordance with a timing from the point of time when the conductor, for example, is irradiated with an electron beam during scanning with the electron beam.

In a case where a phase change film or the like is used as a storage medium as in the foregoing example, a nonvolatile information storage apparatus is obtained. However, the storage medium is not limited to this and various components may be used.

Specifically, an insulator film, for example, may be used to utilize the presence and absence of accumulated charge due to electron avalanche as described in the description of the conventional technique. Alternatively, to store data, charge may be accumulated by injecting electrons into a high-resistance film at low speed or electrons may be implanted at high speed so that the accumulated charge is expelled by electron avalanche. On the other hand, to read stored data, the presence or absence of electron avalanche according to a charged state before irradiation with an electron beam may be detected depending on the amount of current. A component which changes its shape, e.g., comes to have a hall therein or has its thickness reduced by thermal deformation, upon irradiation with a high-energy electron beam and causes current flowing in an electrode at the backside to vary upon irradiation with a low-energy electron beam, such as a thin film made of a metal having a low melting point, may be used. In this case, a component made of a conductive material having a high resistivity, for example, is preferably used so as to make current quickly escape when a portion having its thickness unchanged and other portions is irradiated with an electron beam. Alternatively, a component such as a photonic material which comes to have a fluorescent property by irradiation with a high-energy electron beam may be used so as to detect fluorescence occurring upon irradiation with a low-energy electron beam by using an optical sensor.

The energy of an electron beam is not necessarily controlled by using voltages applied to the cold cathode 101 and the accelerating electrode 102 and may be controlled by changing the duty ratio between pulses applied thereto and the number of such pulses or the diameter of a beam spot through adjustment of the degree of convergence, for example.

Figure 20:
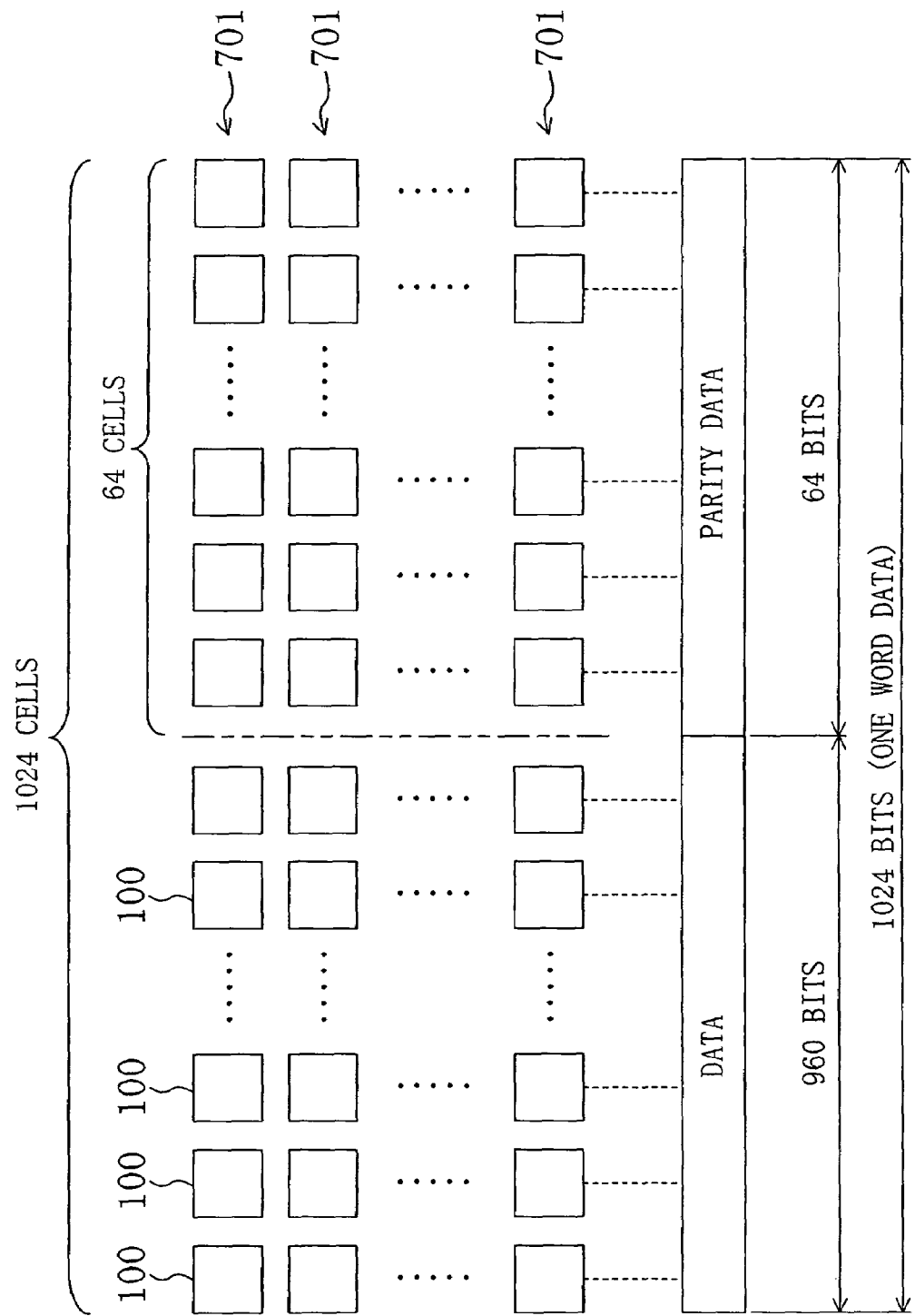
FIG. 20 is an illustration showing an example in which some of the information storage cells are used for error correction.

In a case where a plurality of information storage cells 100 are provided, part of the cells may be used to store error detecting and correcting code. Specifically, as shown in FIG. 20, for example, out of 1024 bits to be written and read out as, for example, one word at the same time from a cell group 701 including 1024 information storage cells 100, 64 bits may be used as parity bits (error detecting and correcting code) for the other 960 bits so that error detection and error correction are performed by a cyclic redundancy check (CRC) or other operations.

INDUSTRIAL APPLICABILITY

As described above, according to the present invention, a minute region of a storage medium is irradiated with an electron beam emitted from a cold cathode so that information is stored and read out. Accordingly, an area necessary for storing one bit is greatly reduced and a large amount of information is stored at a high density. In addition, the apparatus size and power consumption are easily reduced and high-speed access is achieved. A plurality of bits of information is written and read out in parallel so that the speed is further increased. In addition, the position irradiated with an electron beam is subjected to servo control, so that influences of variations in power supply voltage, temperature and fabrication are reduced and high reliability is obtained. As a result, irradiation of the storage medium with an electron beam is effective for information storage apparatuses and others that store and read information.

The invention claimed is:

1. An information storage apparatus comprising:
a cold cathode electron beam emitting part;
a flat anode opposed to the cold cathode electron beam emitting part; and
a storage medium formed on the front or back of the anode and used for storing or reading information in accordance with irradiation with an electron beam emitted from the cold cathode electron beam emitting part,
wherein the cold cathode electron beam emitting part includes a cold cathode placed in a chamber surrounded by a partition and a film capable of transmitting an electron beam, and
the inside of the chamber has a vacuum degree higher than a space sandwiched between the film capable of transmitting an electron beam and the anode.

2. The information storage apparatus of claim 1, wherein an electron beam is accelerated by application of a given voltage to the film capable of transmitting an electron beam.

3. An information storage apparatus comprising:
a cold cathode electron beam emitting part;
a flat anode opposed to the cold cathode electron beam emitting part;
a storage medium formed on the front or back of the anode and used for storing or reading information in accordance with irradiation with an electron beam emitted from the cold cathode electron beam emitting part; and
an accelerating part for accelerating the electron beam emitted from the cold cathode electron beam emitting part by using an electric field,
wherein the accelerating part includes a plurality of electrodes to which voltages with different phases are respectively applied, and
the accelerating part is configured to accelerate the electron beam by generating a moving electric field.

4. An information storage apparatus comprising:
a cold cathode electron beam emitting part;
a flat anode opposed to the cold cathode electron beam emitting part; and
a storage medium formed on the front or back of the anode and used for storing or reading information in accordance with irradiation with an electron beam emitted from the cold cathode electron beam emitting part,
wherein the cold cathode electron beam emitting part includes a plurality of electron-beam emitting parts, and
the electron-beam emitting parts emit respective electron beams at different timings in accordance with a distance from a given center so as to cause the emitted electron beams to converge.

5. An information storage apparatus comprising:
a cold cathode electron beam emitting part;
a flat anode opposed to the cold cathode electron beam emitting part;
a storage medium formed on the front or back of the anode and used for storing or reading information in accordance with irradiation with an electron beam emitted from the cold cathode electron beam emitting part;
a shielding part including a plate member, having a minute hole and configured to generate an electric field for causing the electron beam emitted from the cold cathode electron beam emitting part to converge and pass through the minute hole; and
an actuator part for moving at least one of the shielding part and the storage medium along the surface of the other,
wherein a plurality of regions of the storage medium are allowed to be selectively irradiated with the electron beam.

6. The information storage apparatus of claim 5, wherein the shielding part is configured to generate an electric field for causing the electron beam to converge and pass through the minute hole by application of a voltage to one of the plate member having conductivity and a conductive member provided on the plate member.

7. An information storage apparatus comprising:
a plurality of cold cathode electron beam emitting parts;
a flat anode opposed to the cold cathode electron beam emitting parts;
a storage medium formed on the front or back of the anode and used for storing or reading information in accordance with irradiation with electron beams emitted from the cold cathode electron beam emitting parts;
a plurality of convergence parts for causing each of the electron beams emitted from the cold cathode electron beam emitting parts to converge by using an electric field or a magnetic field; and
a plurality of deflection parts for deflecting each of the electron beams by using an electric field or a magnetic field,
wherein the deflection parts and the convergence parts are configured to cause deflection and convergence of the electron beams emitted from the cold cathode electron beam emitting parts in accordance with a common control signal so that a plurality of bits of information is stored and read out at the same time in/from a plurality of regions of the storage medium.

8. An information storage apparatus comprising:
a plurality of cold cathode electron beam emitting parts;
a flat anode opposed to the cold cathode electron beam emitting parts;
a storage medium formed on the front or back of the anode and used for storing or reading information in accordance with irradiation with electron beams emitted from the cold cathode electron beam emitting parts;
a shielding part for partly transmitting each of the electron beams emitted from the cold cathode electron beam emitting parts; and
an actuator part for moving at least one of the shielding part and the storage medium along the surface of the other in accordance with a control signal for each moving direction,
wherein
a plurality of bits of information is stored or read out at the same time in/from a plurality of regions of the storage medium.

9. The information storage apparatus of claim 8, wherein the shielding part includes a plate member having a plurality of minute holes associated with the respective electron beams.

10. The information storage apparatus of claim 8, further comprising an irradiated-position-shift detecting part for detecting a shift between a given reference position and a position in the storage medium irradiated with each of the electron beams in accordance with the movement of said one of the shielding part and the storage medium by the actuator part, wherein the position irradiated with each of the electron beams is controlled by the actuator part in accordance with a result of the detection by the irradiated-position-shift detecting part.

11. The information storage apparatus of claim 7, further comprising:

an irradiated-position detecting part for detecting a shift from a given reference position in accordance with a detection signal obtained when a irradiated-position detecting portion provided in part of the storage medium is irradiated with an electron beam emitted from at least one of the cold cathode electron beam emitting parts, wherein the position irradiated with the electron beam is controlled by the deflection parts and the convergence parts with respect to one or more electron beams emitted from the other cold cathode electron beam emitting parts in accordance with a result of the detection by the irradiated-position detecting part.

12. The information storage apparatus of claim 10, wherein the irradiated-position-shift detecting part is configured to detect a shift between a given reference position and a position in the storage medium irradiated with at least one electron beam emitted from at least one of the cold cathode electron beam emitting parts, and the position irradiated with the electron beam is controlled by the actuator part with respect to one or more electron beams emitted from the other cold cathode electron beam emitting parts in accordance with a result of the detection by the irradiated-position-shift detecting part.

13. The information storage apparatus of claim 7, wherein an electron beam emitted from a part of the cold cathode electron beam emitting parts is used to store and read at least one of error detecting code and error correcting code in storing or reading of information by using one or more electron beams emitted from the other cold cathode electron beam emitting parts.

14. The information storage apparatus of claim 8, wherein an electron beam emitted from a part of the cold cathode electron beam emitting parts is used to store or read at least one of error detecting code and error correcting code in storing or reading of information by using one or more electron beams emitted from the other cold cathode electron beam emitting parts.

15. The information storage apparatus of claim 11, wherein the irradiation-position detecting portion is a portion including a plurality of minute holes formed in the storage medium, and the irradiated-position detecting part is configured to detect current flowing through the minute holes and perform leaning control in such a manner that control amounts of deflection and convergence at which current is largest is defined as control amounts of deflection and convergence at which a shift from the reference position is smallest.

16. A method for storing information using an information storage apparatus comprising:

a cold cathode electron beam emitting part;
a flat anode opposed to the cold cathode electron beam emitting part;
a storage medium formed on the front or back of the anode and used for storing or reading information in accordance with irradiation with an electron beam emitted from the cold cathode electron beam emitting part; and
an accelerating part for accelerating the electron beam emitted from the cold cathode electron beam emitting part by using an electric field, wherein a moving electric field is generated by applying voltages with different phases to a plurality of electrodes of the accelerating part, thereby accelerating the electron beam.

17. A method for storing information using an information storage apparatus comprising:

a cold cathode electron beam emitting part;
a flat anode opposed to the cold cathode electron beam emitting part; and
a storage medium formed on the front or back of the anode and used for storing or reading information in accordance with irradiation with an electron beam emitted from the cold cathode electron beam emitting part, wherein a plurality of electron-beam emitting parts of the cold cathode electron beam emitting part emit respective electron beams at different timings in accordance with a distance from a given center so as to cause the emitted electron beams to converge.

18. A method for storing information using an information storage apparatus comprising:

a cold cathode electron beam emitting part;
a flat anode opposed to the cold cathode electron beam emitting part; and
a storage medium formed on the front or back of the anode and used for storing or reading information in accordance with irradiation with an electron beam emitted from the cold cathode electron beam emitting part, wherein a shielding part including a plate member having a minute hole generates an electric field for causing the electron beam emitted from the cold cathode electron beam emitting part to converge and pass through the minute hole, and an actuator part causes at least one of the shielding part and the storage medium to move along the surface of the other so that a plurality of regions of the storage medium are allowed to be selectively irradiated with the electron beam.

19. A method for storing information using an information storage apparatus comprising:

a plurality of cold cathode electron beam emitting parts;
a flat anode opposed to the cold cathode electron beam emitting parts;
a storage medium formed on the front or back of the anode and used for storing or reading information in accordance with irradiation with electron beams emitted from the cold cathode electron beam emitting parts;
a plurality of convergence parts for causing each of the electron beams emitted from the cold cathode electron beam emitting parts to converge by using an electric field or a magnetic field; and
a plurality of deflection parts for deflecting each of the electron beams by using an electric field or a magnetic field, wherein the deflection parts and the convergence parts are controlled in accordance with a common control signal to cause deflection and convergence of the electron beams emitted from the cold cathode electron beam emitting parts so that a plurality of bits of information is stored and read out at the same time in/from a plurality of regions of the storage medium.

20. A method for storing information using an information storage apparatus comprising:

a plurality of cold cathode electron beam emitting parts;

a flat anode opposed to the cold cathode electron beam emitting parts;

a storage medium formed on the front or back of the anode and used for storing or reading information in accordance with irradiation with electron beams emitted from the cold cathode electron beam emitting parts;

a shielding part for partly transmitting each of the electron beams emitted from the cold cathode electron beam emitting parts; and an actuator part for moving at least one of the shielding part and the storage medium along the surface of the other, wherein the actuator part is driven in accordance with a control signal for each moving direction, and a plurality of bits of information is stored or read out at the same time in/from a plurality of regions of the storage medium.

* * * * *